United States Patent
Nakamura

(10) Patent No.: US 8,004,332 B2
(45) Date of Patent: Aug. 23, 2011

(54) DUTY RATIO CONTROL APPARATUS AND DUTY RATIO CONTROL METHOD

(75) Inventor: Masayuki Nakamura, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/611,381

(22) Filed: Nov. 3, 2009

(65) Prior Publication Data

US 2011/0102038 A1 May 5, 2011

(51) Int. Cl.
*H03K 3/017* (2006.01)
(52) U.S. Cl. .......................... 327/175; 327/172
(58) Field of Classification Search ............. 327/24, 327/26, 3, 11, 172–176, 158, 159
See application file for complete search history.

(56) References Cited

U.S. PATENT DOCUMENTS

| | | | |
|---|---|---|---|
| 5,675,620 A | 10/1997 | Chen | |
| 6,356,129 B1 | 3/2002 | O'Brien et al. | |
| 6,687,844 B1 * | 2/2004 | Zhang | 713/503 |
| 7,227,920 B2 * | 6/2007 | Heikkila | 375/371 |
| 7,420,399 B2 * | 9/2008 | Han | 327/175 |
| 7,423,919 B2 * | 9/2008 | Lin | 365/194 |
| 7,791,378 B1 * | 9/2010 | Sutardja et al. | 327/12 |

* cited by examiner

*Primary Examiner* — An T Luu
(74) *Attorney, Agent, or Firm* — Chen Yoshimura LLP

(57) ABSTRACT

There are provided a duty ratio control apparatus for altering a duty ratio of a clock signal to output an altered clock signal, including a first variable delay section that outputs a first delayed clock signal generated by delaying the clock signal by a predetermined first delay time, and a phase comparing section that compares, in terms of phase, an edge of the clock signal and an edge of the first delayed clock signal and generates the altered clock signal having a pulse width determined by a phase difference obtained by the comparison, and a duty ratio control method.

12 Claims, 7 Drawing Sheets

DUTY RATIO CONTROL APPARATUS AND DUTY RATIO CONTROL METHOD

BACKGROUND

1. Technical Field

The present invention relates to a duty ratio control apparatus and a duty ratio control method.

2. Related Art

A conventionally known duty ratio control apparatus adjusts the duty ratio of a clock and outputs a resulting clock signal (for example, see Patent Document 1).

Patent Document 1: U.S. Pat. No. 6,356,129
Patent Document 2: U.S. Pat. No. 5,675,620

Such a conventional duty ratio control apparatus, however, suffers from a complex structure and a large circuit scale, for example, due to the use of two different phase-locked loops (PLLs).

SUMMARY

Therefore, it is an object of an aspect of the innovations herein to provide a duty ratio control apparatus and a duty ratio control method which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary apparatus may include a duty ratio control apparatus for altering a duty ratio of a clock signal to output an altered clock signal, including a first variable delay section that outputs a first delayed clock signal generated by delaying the clock signal by a predetermined first delay time, and a phase comparing section that compares, in terms of phase, an edge of the clock signal and an edge of the first delayed clock signal and generates the altered clock signal having a pulse width determined by a phase difference obtained by the comparison. A duty ratio control method is also provided.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
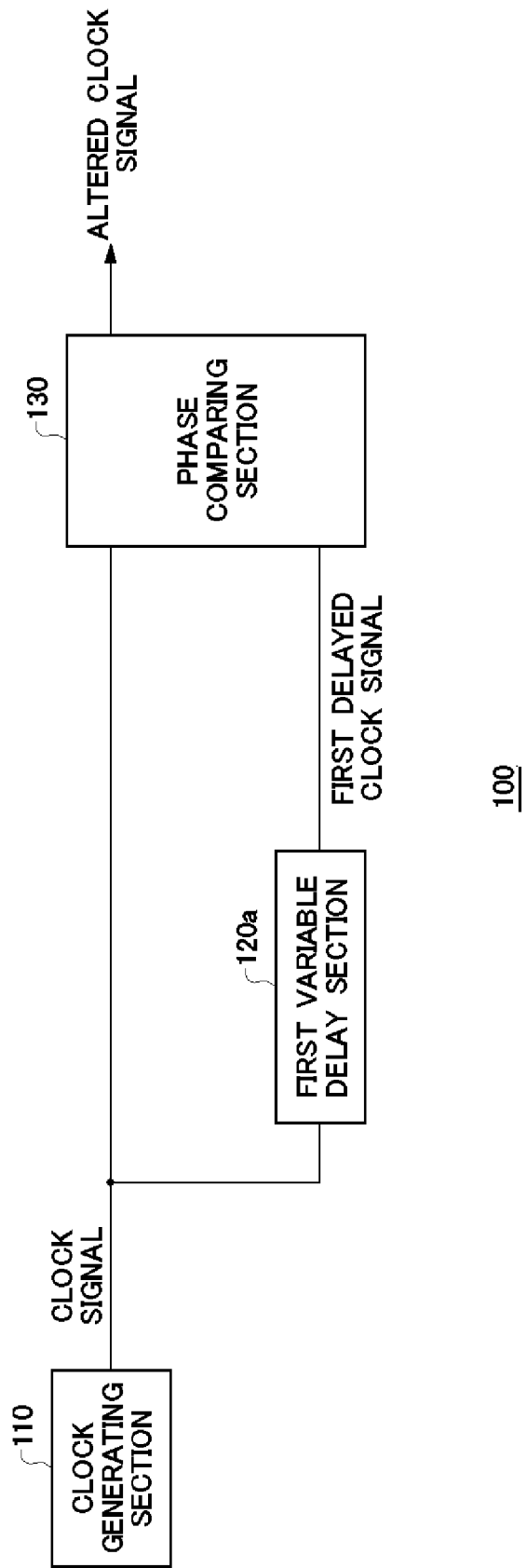
FIG. 1 illustrates an exemplary configuration of a duty ratio control apparatus 100 relating to an embodiment of the present invention.

FIG. 1 illustrates an exemplary configuration of a duty ratio control apparatus 100 relating to an embodiment of the present invention. The duty ratio control apparatus 100 alters the duty ratio of a clock signal and outputs the altered clock signal. The duty ratio control apparatus 100 may supply the altered clock signal having the altered duty ratio to a device such as a digital circuit, a memory, and a system on chip (SOC). The duty ratio control apparatus 100 includes a clock generating section 110, a first variable delay section 120a, and a phase comparing section 130.

The clock generating section 110 generates a clock signal. The clock generating section 110 may be an oscillator circuit using a crystal oscillator or the like. The clock generating section 110 may generate the clock signal in synchronization with a trigger signal supplied thereto from outside.

The first variable delay section 120a, outputs a first delayed clock signal, which is generated by delaying the clock signal by a predetermined first delay time. The first variable delay section 120a, may be formed, for example, by using an integrated programmable delay IC or IQ quadrature modulator. Alternatively, the first variable delay section 120a, may continuously generate a variable delay by using a trombone-like central conductor or the like, or may discontinuously generate a variable delay by switching between a plurality of transmission lines having different lengths.

The phase comparing section 130 compares in terms of phase the edge of the clock signal and the edge of the first delayed clock signal, and generates the altered clock signal having a pulse width determined by the phase difference. The phase comparing section 130 may be a circuit that converts the phase difference between the input two signals into a voltage and outputs a signal representing the resulting voltage. For example, when receiving two clock signals having the same frequency but having different phases, the phase comparing section 130, which is configured to convert the phase difference between the two clock signals into a voltage and outputs the voltage, outputs an altered clock signal that has the same frequency as the input signals and has a pulse width determined by the phase difference. The phase comparing section 130 may be a circuit using a flip-flop, for example. Alternatively, the phase comparing section 130 may be a circuit using an analog multiplier, or a circuit using an XOR circuit, a charge pump and the like.

Figure 2:
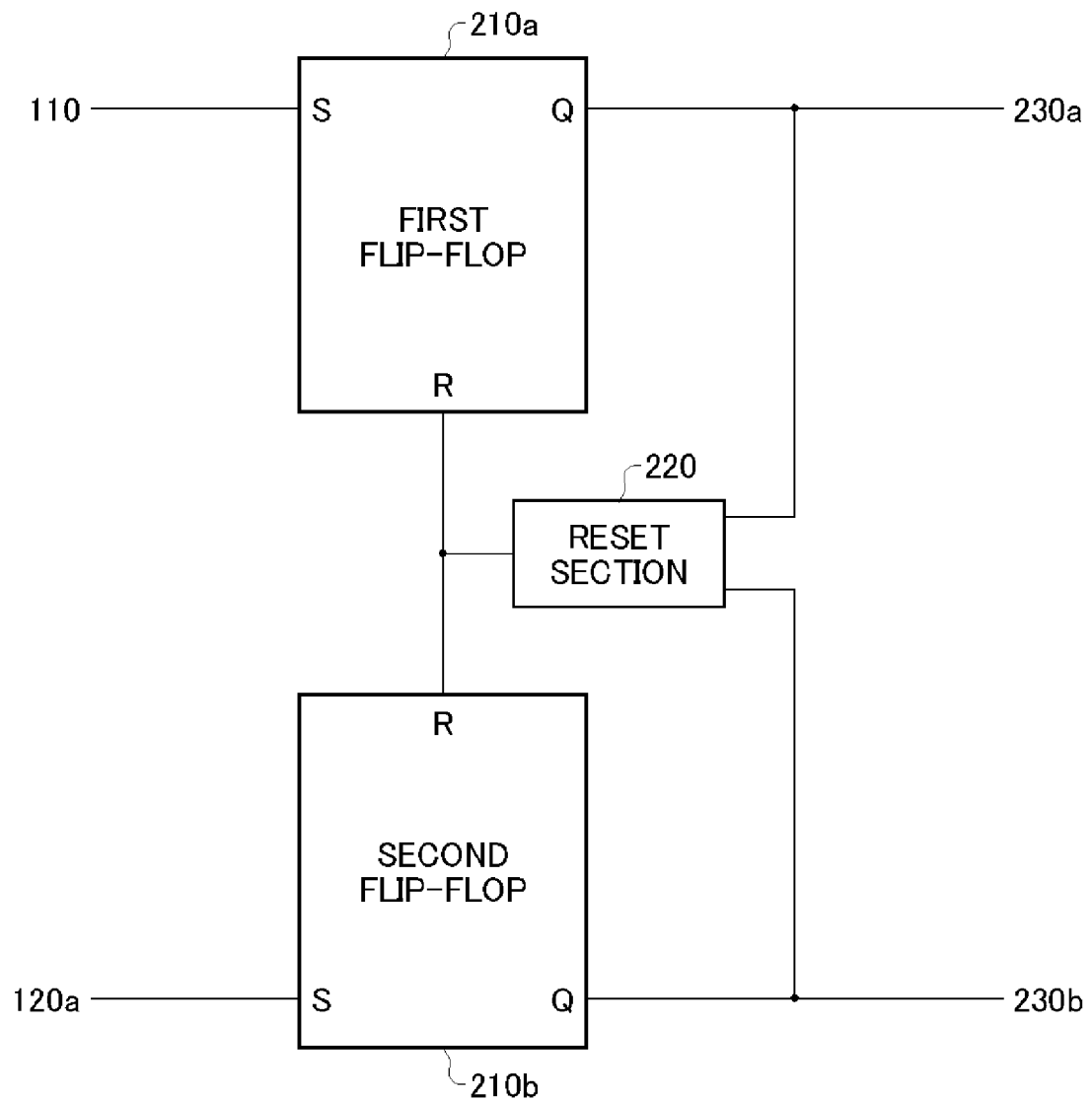
FIG. 2 illustrates an exemplary configuration of a phase comparing section 130 relating to the embodiment of the present invention.

FIG. 2 illustrates an exemplary configuration of the phase comparing section 130 relating to the embodiment of the present invention. The phase comparing section 130 compares the phase of the clock signal generated by the clock generating section 110 with the phase of the first delayed clock signal output from the first variable delay section 120a, and generates a clock signal having a pulse width determined by the phase difference. The phase comparing section 130 includes a first flip-flop 210a, a second flip-flop 210b, and a reset section 220.

The first flip-flop 210a, is set in accordance with the edge of the clock signal generated by the clock generating section 110, and outputs a first altered clock signal representing its internal state from a first altered clock signal output 230a. The second flip-flop 210b, is set in accordance with the edge of the first delayed clock signal output from the first variable delay section 120a, and outputs a second altered clock signal representing its internal state from a second altered clock signal output 230b.

The reset section 220 resets the first and second flip-flops 210a, and 210b, on condition that the first and second flip-flops 210a, and 210b, are both set. The reset section 220 may be a logical AND circuit, for example.

According to the phase comparing section 130, when the phase of the first delayed clock signal is behind the phase of the clock signal generated by the clock generating section 110, for example, the first flip-flop 210a, is set by the clock signal generated by the clock generating section 110 and the clock signal is output as the rising edge of the first altered clock signal from the first altered clock signal output 230a. Next in the phase comparing section 130, the second flip-flop 210b, is set by the first delayed clock signal with the later phase, and the reset section 220 then immediately resets the first and second flip-flops 210a, and 210b.

In other words, the phase comparing section 130 generates a first altered clock signal having a pulse width determined by the phase difference between the first delayed clock signal and the clock signal generated by the clock generating section 110, and outputs the generated first altered clock signal from the first altered clock signal output 230a. Here, in a case where the phase of the first delayed clock signal is behind the phase of the clock signal generated by the clock generating section 110 by a phase difference in a range of 0, to the period of the clock, the phase comparing section 130 can output from the first altered clock signal output 230a, the first altered clock signal having a pulse width determined by the phase difference.

According to the phase comparing section 130, when the phase of the first delayed clock signal is ahead the phase of the clock signal generated by the clock generating section 110, for example, the second flip-flop 210b, is set by the first delayed clock signal and the first delayed clock signal is output as the rising edge of the second altered clock signal from the second altered clock signal output 230b. Next in the phase comparing section 130, the first flip-flop 210a, is set by the clock signal with the later phase, and the reset section 220 then immediately resets the first and second flip-flops 210a, and 210b.

In other words, the phase comparing section 130 generates a second altered clock signal having a pulse width determined by the phase difference between the first delayed clock signal and the clock signal generated by the clock generating section 110, and outputs the generated second altered clock signal from the second altered clock signal output 230b. Here, in a case where the phase of the first delayed clock signal is ahead the phase of the clock signal generated by the clock generating section 110 by a phase difference in a range of 0, to the period of the clock, the phase comparing section 130 can output from the second altered clock signal output 230b, the second altered clock signal having a pulse width determined by the phase difference.

The duty ratio control apparatus 100 may output the first altered clock signal that is output from the first altered clock signal output 230a, or output the second altered clock signal that is output from the second altered clock signal output 230b. The duty ratio control apparatus 100 may select one of the first and second altered clock signals and output the selected altered clock signal.

Figure 3:
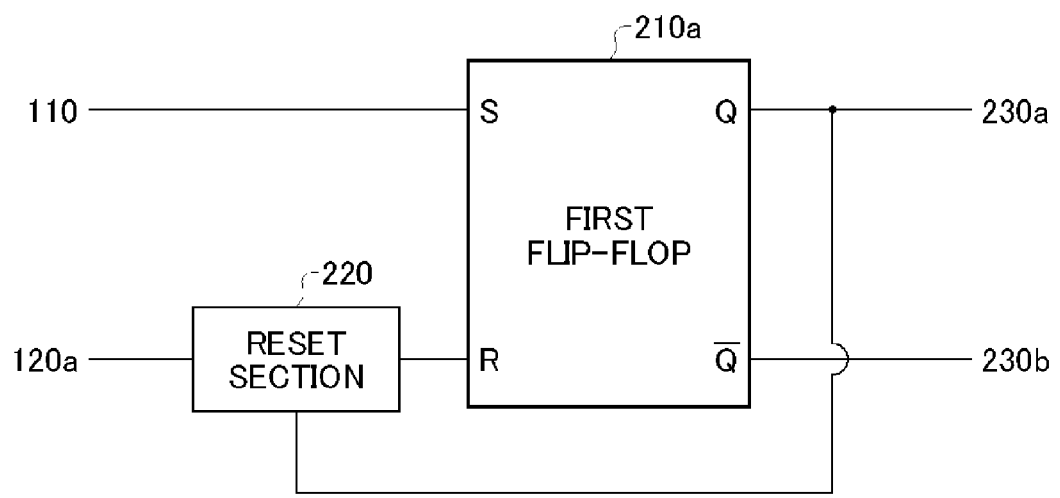
FIG. 3 illustrates a modification example of the phase comparing section 130 relating to the embodiment of the present invention.

FIG. 3 illustrates a modification example of the phase comparing section 130 relating to the embodiment of the present invention. In FIG. 3, the constituents assigned with the same reference numerals as in FIG. 2 have substantially the same functions and configurations as described with reference to FIG. 2. Therefore, the configuration shown in FIG. 3 is not explained except for its difference from the configuration shown in FIG. 2. According to the present modification example, the phase comparing section 130 includes a reset section 220 that resets the first flip-flop 210a, in accordance with the edge of the first delayed clock signal under a necessary condition that the first flip-flop has been set.

According to the phase comparing section 130, when the phase of the first delayed clock signal is behind the phase of the clock signal generated by the clock generating section 110, for example, the first flip-flop 210a, is set by the clock signal generated by the clock generating section 110 and the clock signal is output as the rising edge of the first altered clock signal from the first altered clock signal output 230a. Subsequently, the reset section 220 resets the first flip-flop 210a, in response to the input of the first delayed clock signal with the later phase into the reset section 220.

In other words, the phase comparing section 130 generates a first altered clock signal having a pulse width determined by the phase difference between the first delayed clock signal and the clock signal generated by the clock generating section 110, and outputs the generated first altered clock signal from the first altered clock signal output 230a. Here, in a case where the phase of the first delayed clock signal is behind the phase of the clock signal generated by the clock generating section 110 by a phase difference in a range of 0, to the period of the clock, the phase comparing section 130 can generate the first altered clock signal having a pulse width determined by the phase difference and output from the first altered clock signal output 230a, the first altered clock signal.

According to the above description of the modification example of the phase comparing section 130, the reset section 220 resets the first flip-flop 210a, in response to the edge of the first delayed clock signal under a necessary condition that the first flip-flop 210a, is set. As an alternative example, the reset section 220 may be connected to the set side of the first flip-flop 210a, and thus may set the first flip-flop 210a, in response to the edge of the clock signal from the clock generating section 110 under a necessary condition that the inverse output of the first flip-flop 210a, is kept on. When having the above alternative configuration, the phase comparing section 130 can output, from the second altered clock signal output 230b, a second altered clock signal having a pulse width determined by the phase difference in a case where the phase of the first delayed clock signal is ahead the phase of the clock signal generated by the clock generating section 110 by a phase difference in a range of 0, to the period of the clock.

Figure 4:
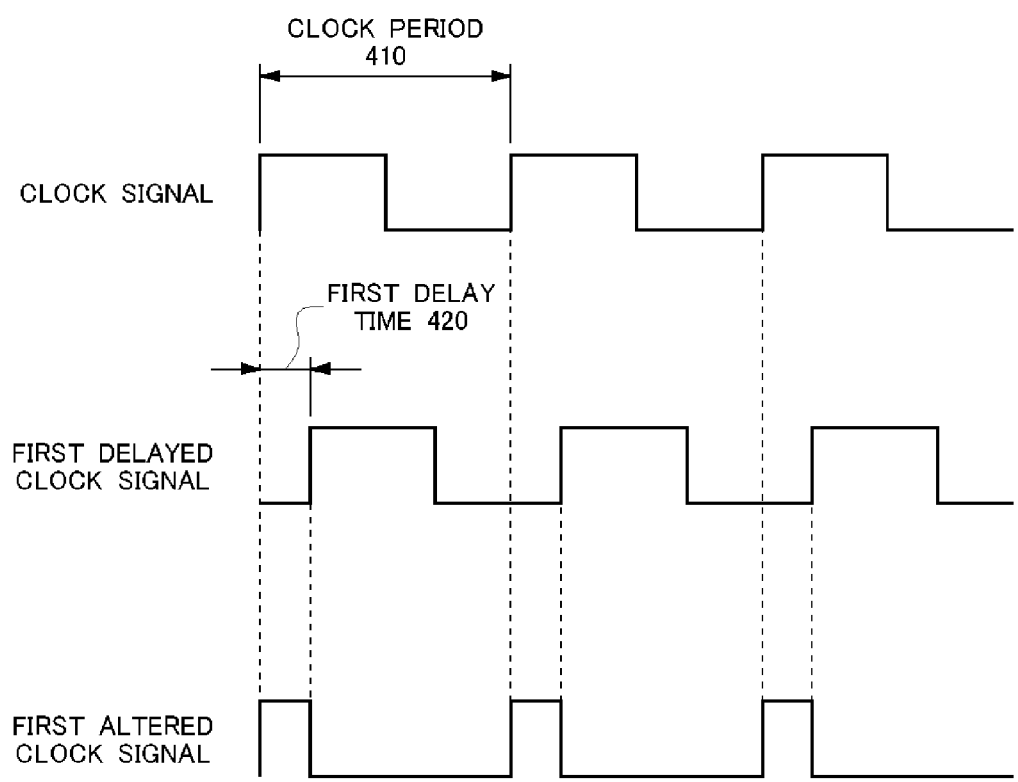
FIG. 4 illustrates an exemplary clock signal and an exemplary altered clock signal of the duty ratio control apparatus 100 relating to the embodiment of the present invention.

FIG. 4 illustrates an exemplary clock signal and an exemplary altered clock signal of the duty ratio control apparatus 100 relating to the embodiment of the present invention. The clock generating section 110 generates a clock signal having a clock period 410. The first variable delay section 120a, outputs a first delayed clock signal, which is generated by delaying the clock signal by a predetermined first delay time 420. In the example shown in FIG. 4, the first variable delay section 120*a*, outputs the first delayed clock signal, which is delayed by the first delay time 420 that is 20% of the clock period 410.

The phase comparing section 130 compares in terms of phase the edge of the clock signal and the edge of the first delayed clock signal, and generates an altered clock signal having a pulse width determined by the phase difference. The phase comparing section 130 outputs a phase difference signal that rises at the rising of the clock signal and that falls at the rising of the first delayed clock signal, thereby outputting the first altered clock signal that has a period equal to the clock period 410 and has a pulse width substantially equal to the first delay time 420. In other words, the duty ratio control apparatus 100 outputs the first altered clock signal having a duty ratio corresponding to the predetermined first delay time 420, with a period equal to the clock period 410 of the clock signal generated by the clock generating section 110.

Figure 5:
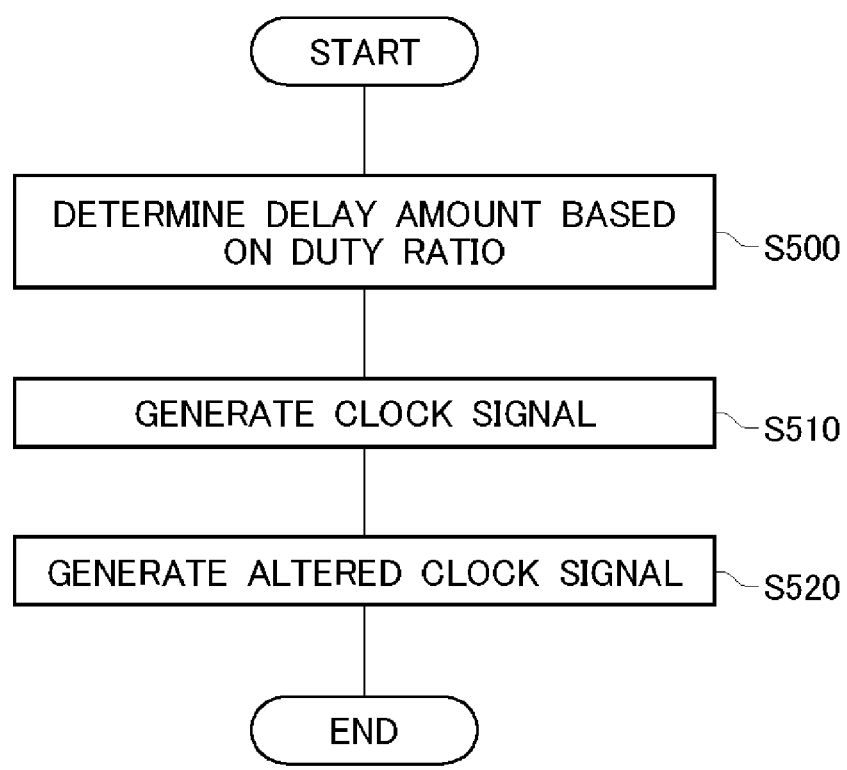
FIG. 5 illustrates a flow of operations performed by the duty ratio control apparatus 100 relating to the embodiment of the present invention.

FIG. 5 illustrates a flow of operations performed by the duty ratio control apparatus 100 relating to the embodiment of the present invention. The duty ratio control apparatus 100 determines the delay amount of the first variable delay section 120*a*, based on a desired duty ratio (S500). For example, when the desired duty ratio is 20%, the duty ratio control apparatus 100 determines the delay amount of the first variable delay section 120*a*, to be equal to 20% of the period of the clock signal generated by the clock generating section 110.

Subsequently, the duty ratio control apparatus 100 uses the clock generating section 110 to generate a clock signal (S510). The clock generating section 110 supplies the clock signal to the phase comparing section 130 without a change, and to the phase comparing section 130 via the first variable delay section 120*a*. Here, the duty ratio control apparatus 100 may be able to tell which one of the two clock signals received by the phase comparing section 130 is ahead (behind) the other in terms of phase, with reference to the length of the clock transmission line and the delay amount of the first variable delay section 120*a*. Alternatively, the duty ratio control apparatus 100 may include a delay determining section that determines which one of the clock signals comes ahead (behind) the other in terms of phase by adjusting the delay amount of the first variable delay section 120*a*.

The phase comparing section 130 generates a first altered clock signal that has a pulse width determined by the phase difference between the first delayed clock signal and the clock signal and has a period equal to the period of the received clock signal and first delayed clock signal (S520). For example, when the duty ratio control apparatus 100 determines the delay amount of the first variable delay section 120*a*, to be equal to 20% of the period of the clock signal, the phase comparing section 130 generates the first altered clock signal that has a pulse width equal to 20% of the period of the clock signal and has a period equal to the period of the received clock signal and first delayed clock signal. In other words, the duty ratio control apparatus 100 can output a first altered clock signal having a desired duty ratio and a period equal to the period of the clock signal, by determining the delay amount of the first variable delay section 120*a*, to be equal to a desired delay amount.

In the above-described exemplary embodiment, the duty ratio control apparatus 100 determines the delay amount of the first variable delay section 120*a*, to be in accordance with a desired duty ratio. Alternatively, the duty ratio control apparatus 100 may determine the delay amount of the first variable delay section 120*a*, in such a manner that the sum of (i) the difference in transmission line length between the clock signal and the first delayed clock signal and (ii) the delay amount of the first variable delay section 120*a*, is in accordance with the desired duty ratio. In this manner, the duty ratio control apparatus 100 can accurately output an altered clock signal with a desired duty ratio, by determining the delay amount of the first variable delay section 120*a*, taking into consideration compensation for the difference in transmission line length between the clock signal and the first delayed clock signal.

According to the duty ratio control apparatus 100, since the phase comparing section 130 receives the clock signal and the first delayed clock signal that have the same frequency and a predetermined phase difference, the set input and the reset input of the flip-flop included in the phase comparing section 130 never be kept active simultaneously. Therefore, no circumstances that make the output signal unstable occur in the duty ratio control apparatus 100, and the duty ratio control apparatus 100 can output a stable altered clock signal.

Figure 6:
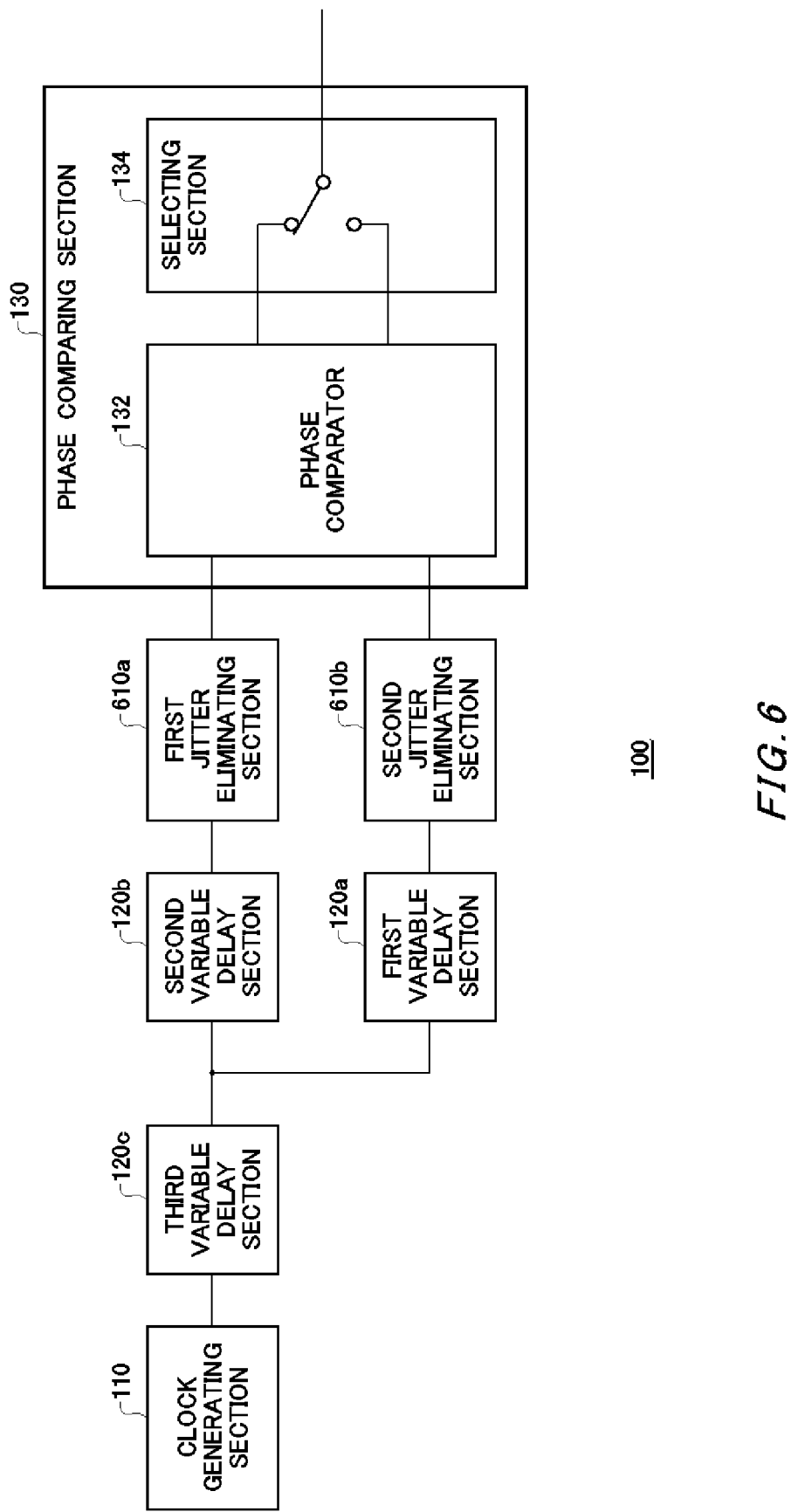
FIG. 6 illustrates a modification example of the duty ratio control apparatus 100 relating to the embodiment of the present invention.

FIG. 6 illustrates a modification example of the duty ratio control apparatus 100 relating to the embodiment of the present invention. The duty ratio control apparatus 100 according to the present modification example has substantially the same configuration and function as the duty ratio control apparatus 100 relating to the embodiment shown in FIG. 1. Therefore, the same reference numerals are assigned in FIG. 6 to the constituents substantially the same as the corresponding constituents of the duty ratio control apparatus 100 shown in FIG. 1, and the following description of the modification example only mentions the differences between the embodiment and the modification example. The duty ratio control apparatus 100 may include a second variable delay section 120*b*, and/or a third variable delay section 120*c*, in addition to the first variable delay section 120*a*.

The duty ratio control apparatus 100 further includes a second variable delay section that outputs a second delayed clock signal, which is generated by delaying the clock signal by a predetermined second delay time. The phase comparing section 130 may generate an altered clock signal having a pulse width determined by the phase difference obtained by comparing in terms of phase the edges of the first and second delayed clock signals. The duty ratio control apparatus 100 may determine which one of the first and second delayed clock signals is ahead (behind) the other in terms of phase by a variable delay section provided in each of the two signal line branches.

Here, the phase comparing section 130 can output a first altered clock signal having a pulse width determined by a phase difference in a case where the phase of the first delayed clock signal is delayed with respect to the phase of the second delayed clock signal by a phase lag in a range of 0, to half the clock period (a range of duty ratios from 0% to 50%). However, the phase comparing section 130 may not be able to output altered clock signals in a case where the phase lag is equal to or more than half the clock period and in a case where the phase of the first delayed clock signal is ahead the phase of the second delayed clock signal. When the phase comparing section 130 has such a problem and the phase of the first delayed clock signal is ahead the phase of the second delayed clock signal, the duty ratio control apparatus 100 may adjust the delay amount determination in such a manner that the phase of the first delayed clock signal comes behind the phase of the second delayed clock signal by a phase difference in a range of 0, to half the clock period.

For example, when the phase of the first delayed clock signal is ahead of the phase of the second delayed clock signal by a phase difference equal to 20% of the clock period, the phase comparing section 130 having the above-mentioned problem cannot output an altered clock with a duty ratio of 20% in correspondence with the phase difference of 20%. To solve this problem, the duty ratio control apparatus 100 adds a delay time equal to 40% of the clock period to the delay time of the first variable delay section 120a, to inverse the phase lead to a phase lag without changing the phase difference equal to 20% of the clock period.

As a result of the above adjustment, the first delayed clock signal has a phase lag equal to 20% of the clock period with respect to the second delayed clock signal. Thus, the phase comparing section 130 can output from the first altered clock signal output 230a, a first altered clock signal having a duty ratio of 20%. Depending on which one of the first and second delayed clock signals is behind (ahead) the other in terms of phase, the duty ratio control apparatus 100 appropriately determines the delay times of the first and second variable delay sections 120a, and 120b, thereby outputting a clock signal having an appropriate pulse width even when the phase comparing section 130 used can only detect a narrow range of phase differences.

The duty ratio control apparatus 100 may include the first and second variable delay sections 120a, and 120b, with different resolutions. For example, the duty ratio control apparatus 100 may use a variable delay section with a high resolution, but cannot output a clock signal having a desired duty ratio when the variable range of the variable delay section is to small compared with the clock period. Therefore, the duty ratio control apparatus 100 may form one of the first and second variable delay sections 120a, and 120b, by using a variable delay section that has a wide variable range but a low resolution for the delay amount, and form the other by using a variable delay section that has a narrow variable range but a high resolution for the delay amount. In this way, the duty ratio control apparatus 100 can achieve a high resolution for the delay amount with it being possible to have a delay amount variable range equal to or larger than the clock period, thereby increasing the accuracy of the duty ratio of the altered clock signal to be output therefrom.

The duty ratio control apparatus 100 may further include a third variable delay section that delays an input clock signal input thereto from outside by a predetermined third delay time and thus outputs the clock signal that has been delayed by the third delay time with respect to the input clock signal. In this manner, the duty ratio control apparatus 100 can adjust the output timing of the altered clock signal having a variable duty ratio.

The phase comparing section 130 may include a phase comparator 132 and a selecting section 134. The phase comparator 132 compares in terms of phase the edge of the clock signal against the edge of the first delayed clock signal. When the edge of the clock signal is ahead the edge of the first delayed clock signal, the phase comparator 132 outputs a first phase difference signal having a pulse width determined by the phase difference. When the edge of the clock signal is behind the edge of the first delayed clock signal, the phase comparator 132 outputs a second phase difference signal having a pulse width determined by the phase difference. The selecting section 134 selects one of the first and second phase difference signals to be output as the altered clock signal. The phase comparator 132 may operate in substantially the same manner as the phase comparing section 130 shown in the examples of FIGS. 2 and 3.

For example, the selecting section 134 may make a selection on the first and second altered clock signal outputs 230a, and 230b, of the phase comparing section 130 shown in FIGS. 2 and 3. For example, when the phase comparator 132 operates in substantially the same manner as the phase comparing section 130 shown in FIG. 2, the first altered clock signal output 230a, outputs a phase comparison result obtained in a case where the phase of the first delayed clock signal is behind. On the other hand, the second altered clock signal output 230b, outputs a clock having a duty ratio obtained in a case where the phase of the first delayed clock signal is ahead. Therefore, the selecting section 134 can output a clock depending on which one of the two clock signals is ahead (behind) the other, by selecting an appropriate one of the first and second altered clock signal outputs 230a, and 230b, of the phase comparator 132.

As an alternative example, when the phase comparator 132 operates in substantially the same manner as the phase comparing section 130 shown in the example of FIG. 3, the first altered clock signal output 230a, outputs a phase comparison result obtained in a case where the phase difference ranges from 0, to half the clock period. On the other hand, the second altered clock signal output 230b, outputs a clock having a duty ratio obtained in a case where the phase difference is equal to or more than half the clock period. Therefore, the selecting section 134 can output an altered clock signal having a desired duty ratio, by selecting appropriate one of the first and second altered clock signal outputs 230a, and 230b, of the phase comparator 132.

The duty ratio control apparatus 100 may further include a first jitter eliminating section 610a, that eliminates jitter from the clock signal and supplies the resulting clock signal to the phase comparing section 130, and a second jitter eliminating section 610b, that eliminates jitter from the first delayed clock signal and supplies the resulting signal to the phase comparing section 130. The first and second jitter eliminating sections 610a, and 610b, eliminate the jitter of the clock signal generated by the clock generating section 110. The first jitter eliminating section 610a, and/or the second jitter eliminating section 610b, may be a PLL circuit.

The PLL circuit is an electronic circuit that causes the output signal to have the same frequency as the input signal. The PLL circuit detects a phase difference between the input signal and the output signal and controls an oscillator and/or the loop of the circuit, to output a signal having a frequency accurately synchronized with the frequency of the input signal. The duty ratio control apparatus 100 can output an altered clock signal without jitter and with a variable duty ratio by constituting the first jitter eliminating section 610a, and/or the second jitter eliminating section 610b, by using PLL circuits, which are configured to receive the clock signal generated by the clock generating section 110.

Figure 7:
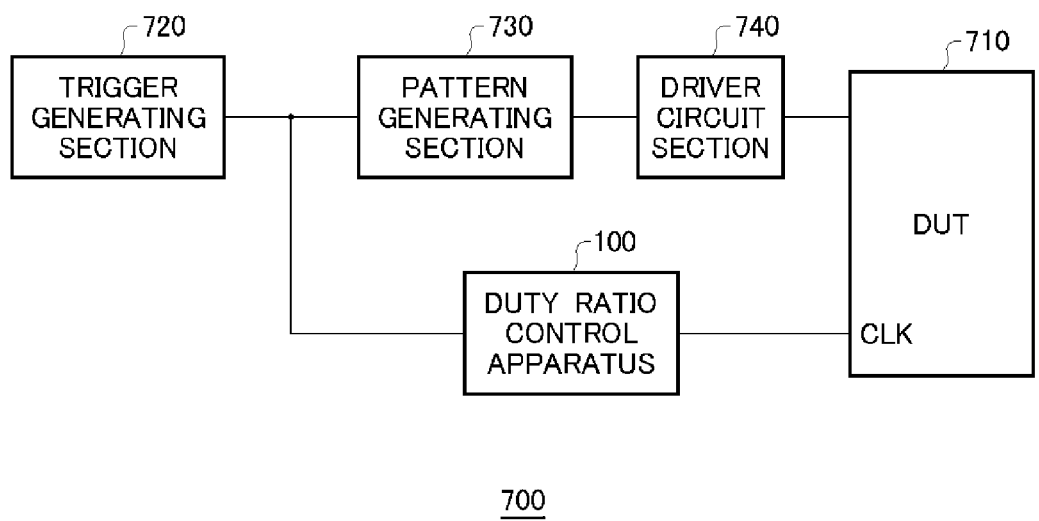
FIG. 7 illustrates an exemplary configuration of a test apparatus 700 relating to an embodiment of the present invention, together with a DUT 710.

FIG. 7 illustrates an exemplary configuration of a test apparatus 700 relating to an embodiment of the present invention, together with a DUT 710. The test apparatus 700 tests the DUT 710 such as an analog circuit, a digital circuit, a memory, and a system on chip (SOC). The test apparatus 700 inputs into the DUT 710 a test signal, which is generated based on a test pattern for testing the DUT 710, and judges the acceptability of the DUT 710 based on the output signal output from the DUT 710 in response to the test signal. The test apparatus 700 includes the duty ratio control apparatus 100, a trigger generating section 720, a pattern generating section 730, and a driver circuit section 740.

The trigger generating section 720 may generate a trigger signal indicative of, for example, a start of a test, based on a test program. The trigger generating section 720 may transmit the trigger signal to the duty ratio control apparatus 100 and the pattern generating section 730. The duty ratio control apparatus 100 receives the trigger signal transmitted from the trigger generating section 720, and outputs a clock signal whose duty ratio has been altered to a predetermined duty ratio. The duty ratio control apparatus 100 may transmit the altered clock signal to the clock input of the DUT 710.

The pattern generating section 730 generates the test signal based on the test pattern and transmits the test signal to the driver circuit section 740, in response to its reception of the trigger signal transmitted from the trigger generating section 720. The pattern generating section 730 may also generate an expected value for a response signal. The test apparatus 700 may judge whether the logic value of the response signal from the DUT 710 matches the expected value of the response signal that is generated by the pattern generating section 730. The driver circuit section 740 amplifies the test signal output from the pattern generating section 730 and transmits the amplified test signal to the DUT 710. The test apparatus 700 may include a plurality of pattern generating sections 730 and a plurality of driver circuit sections 740.

The above-described test apparatus 700 can alter the duty ratio of the clock signal to be supplied to the DUT 710 to a predetermined duty ratio, thereby performing tests by using altered clock signals having different duty ratios but having the same frequency. The test apparatus 700 can also supply altered clocks with variable duty ratios and reduced jitter by having a jitter eliminating circuit in the duty ratio control apparatus 100.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A duty ratio control apparatus for altering a duty ratio of a clock signal to output an altered clock signal, comprising:
    a first variable delay section that outputs a first delayed clock signal generated by delaying the clock signal by a predetermined first delay time; and
    a phase comparing section that compares, in terms of phase, an edge of the clock signal and an edge of the first delayed clock signal and generates the altered clock signal having a pulse width determined by a phase difference obtained by the comparison, wherein
    the phase comparing section includes:
        a phase comparator that compares in terms of phase the edge of the clock signal and the edge of the first delayed clock signal, the phase comparator outputting a first phase difference signal having a pulse width determined by a phase difference obtained when the edge of the clock signal is ahead the edge of the first delayed clock signal, the phase comparator outputting a second phase difference signal having a pulse width determined by a phase difference obtained when the edge of the clock signal is behind the edge of the first delayed clock signal; and
        a selecting section that selects one of the first and second phase difference signals to be output as the altered clock signal.

2. The duty ratio control apparatus as set forth in claim 1, wherein
    the phase comparing section includes:
        a first flip-flop that is set in accordance with the edge of the clock signal and outputs the altered clock signal representing an internal state thereof; and
        a reset section that resets the first flip-flop in accordance with the edge of the first delayed clock signal under a necessary condition that the first flip-flop is set.

3. The duty ratio control apparatus as set forth in claim 2, wherein
    the phase comparing section further includes a second flip-flop that is set in accordance with the edge of the first delayed clock signal, and
    the reset section resets the first and second flip-flops, on condition that the first and second flip-flops are both set.

4. The duty ratio control apparatus as set forth in claim 1, further comprising:
    a first jitter eliminating section that eliminates jitter from the clock signal and supplies the resulting clock signal to the phase comparing section; and
    a second jitter eliminating section that eliminates jitter from the first delayed clock signal and supplies the resulting first delayed clock signal to the phase comparing section.

5. A duty ratio control apparatus for altering a duty ratio of a clock signal to output an altered clock signal, comprising:
    a first variable delay section that outputs a first delayed clock signal generated by delaying the clock signal by a predetermined first delay time;
    a second variable delay section that outputs a second delayed clock signal generated by delaying the clock signal by a predetermined second delay time; and
    a phase comparing section that compares, in terms of phase, an edge of the first delayed clock signal and an edge of the second delayed clock signal and generates the altered clock signal having a pulse width determined by a phase difference obtained by the comparison.

6. The duty ratio control apparatus as set forth in claim 5, further comprising
    a third variable delay section that delays an input clock signal input thereto from outside by a predetermined third delay time and outputs, as the clock signal, a signal that is delayed by the third delay time with respect to the input clock signal.

7. A duty ratio control method for altering a duty ratio of a clock signal to output an altered clock signal, comprising:
    outputting a first delayed clock signal generated by delaying the clock signal by a predetermined first delay time; and
    comparing, in terms of phase, an edge of the clock signal and an edge of the first delayed clock signal, outputting a first phase difference signal having a pulse width determined by a phase difference obtained when the edge of the clock signal is ahead the edge of the first delayed clock signal, outputting a second phase difference signal having a pulse width determined by a phase difference obtained when the edge of the clock signal is behind the edge of the first delayed clock signal and selecting one of the first and second phase difference signals to be output as the altered clock signal.

8. The duty ratio control method as set forth in claim 7, wherein
    the comparing step includes:
        outputting, as the altered clock signal, a signal representing an internal state of a first flip-flop that is set in accordance with the edge of the clock signal; and resetting the first flip-flop in accordance with the edge of the first delayed clock signal under a necessary condition that the first flip-flop is set.

9. The duty ratio control method as set forth in claim 8, wherein the comparing step further includes resetting the first flip-flop and a second flip-flop, which is set in accordance with the edge of the first delayed clock signal, on condition that the first and second flip-flops are both set.

10. The duty ratio control method as set forth in claim 7, further comprising:

eliminating jitter from the clock signal; and eliminating jitter from the first delayed clock signal.

11. A duty ratio control method of altering a duty ratio of a clock signal, comprising:

outputting a first delayed clock signal generated by delaying the clock signal by a predetermined first delay time;

outputting a second delayed clock signal generated by delaying the clock signal by a second predetermined delay time; and comparing, in terms of phase, an edge of the first delayed clock signal and an edge of the second delayed clock signal and outputting an altered clock signal having a pulse width determined by a phase difference obtained by the comparison.

12. The duty ratio control method as set forth in claim 11, further comprising delaying an input clock signal by a predetermined third delay time and outputting, as the clock signal, a signal that is delayed by the third delay time with respect to the input clock signal.

* * * * *